CRYSTAL CONTROLLED HIGH FREQUENCY TRANSISTOR OSCILLATOR

Filed June 18, 1958

INVENTOR:
WOO F. CHOW,

BY Joseph P. Kates
HIS ATTORNEY.

3,025,476

CRYSTAL CONTROLLED HIGH FREQUENCY TRANSISTOR OSCILLATOR

Woo Foung Chow, Syracuse, N.Y., assignor to General Electric Company, a corporation of New York
Filed June 18, 1958, Ser. No. 742,941
7 Claims. (Cl. 331—116)

The present invention relates to a crystal controlled high frequency transistor oscillator and more particularly relates to oscillators utilizing junction transistors wherein there is no external feedback path and the frequency of oscillation may be determined by the crystal itself, and wherein the circuit may be operated at harmonics of the crystal as well as at its fundamental frequency with comparatively high power output.

Crystal controlled oscillators are frequently used in communication equipment. Whether used as the master oscillator of a transmitter or as the local oscillator in a receiver, the oscillator must provide a frequency of oscillation which will be stable with changes of supply voltage and of ambient temperature and will be such that oscillator frequency shall be determined only by the crystal. Prior art crystal controlled transistor oscillators normally utiized an external feedback circuit and the crystal was used either in the series resonance mode or in the parallel resonance mode to control frequency. Prior art vacuum tube crystal oscillators such as the Pierce oscillator, the Miller oscillator, the bridged T oscillator, the Butler cathode-coupled oscillator and the transformer-coupled oscillator also had very serious stability and frequency control limitations and the fields of application were seriously limited. In prior art crystal controlled transistor oscillators utilizing the series resonance mode or the parallel resonance mode to control frequency disadvantages of such circuits were that very often the circuit oscillated without the crystal and consequently the frequency of oscillation was not necessarily of desired value. These effects appeared with stray capacitance across the crystal for the case of series resonance operation and in the case of parallel resonance operation, this occurred where there was too much circuit impedance in series with the crystal. In addition, prior art oscillators of both the transistor and tube type were often not able to oscillate at the overtone frequency of the crystal. This ability to oscillate at the overtone frequency is very important for frequencies close to the VHF region and for higher frequencies. The transistor oscillator of the present invention overcomes these and other deficiencies of the prior art and in addition provides a stable oscillator which will even oscillate in a stable manner with changes of supply voltage and of ambient temperature and wherein the frequency of oscillation will be determined solely by the crystal and wherein high oscillator power output will be effected.

The transistor crystal controlled oscillator of the present invention has further advantages over the vacuum tube oscillator and over transistor crystal controlled oscillators which are the analogues of tube circuits in that the oscillator of this invention provides for increased stability and will oscillate at the overtone frequency of the crystal especially in the very high frequency region.

Accordingly, an object of the present invention is to provide a crystal controlled oscillator which will be stable despite changes in supply voltage and changes in ambient temperature.

Another purpose of the present invention is to provide a stable crystal controlled transistor oscillator which will be able to oscillate at the overtone frequency of the crystal, especially in the very high frequency region or higher.

Another aim of the present invention is to provide a crystal controlled high frequency transistor oscillator wherein there will be no external feedback path and the frequency of oscillation may be determined by the crystal only and wherein the circuit may oscillate at harmonics of the crystal as well as its fundamental frequency and provide for high power output.

Another object of the present invention is to provide a crystal controlled transistor oscillator which does not require an external feedback circuit, which will not be undesirably effected by stray capacitance across the crystal or by circuit impedance in series with the crystal and which will oscillate with high power at the overtone frequency of the crystal.

Another purpose of the present invention is to provide a crystal controlled high frequency transistor oscillator which will not be adversely effected appreciably by changes in ambient temperature, which will provide for frequency stability and which will comprise a simplified circuit with a minimum of necessary elements.

Another aim of the present invention is to provide a crystal controlled high frequency transistor oscillator wherein the crystal may be used at a frequency between its series resonance frequency and its parallel resonance frequency and wherein minimum frequency deviation will occur.

Another object of the present invention is to provide a crystal controlled transistor oscillator which will enable ready interchangeability of different crystals (overtone) in the same circuit to cause the circuit to oscillate either at the fundamental frequency or at its odd harmonics (by simply exchanging the single element).

Another object of the present invention is to provide a transistor crystal oscillator wherein variation of transistor properties with temperature and of crystal properties with temperature will compensate each other thereby resulting in excellent frequency stability despite changes in temperature or other conditions.

While the novel and distinctive features of the invention are particularly pointed out in the appended claims, a more expository treatment of the invention, in principle and in detail, together with additional objects and advantages thereof, is afforded by the following description and accompanying drawings in which:

Figures 4, 5:
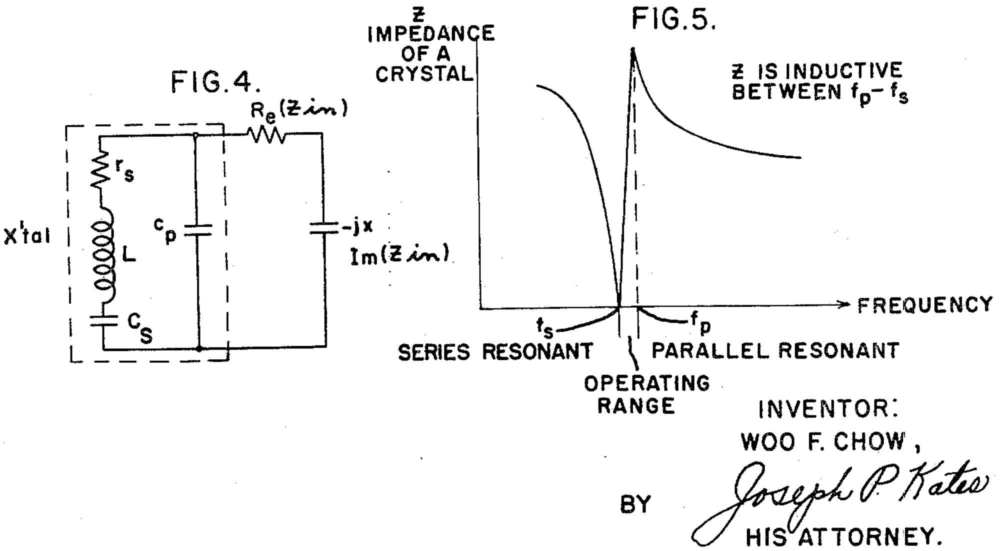

FIG. 4 presents an equivalent circuit for the oscillator; and

FIG. 5 is a graphical representation of crystal property values obtained with one embodiment of the crystal oscillator of the present invention.

Figure 1:
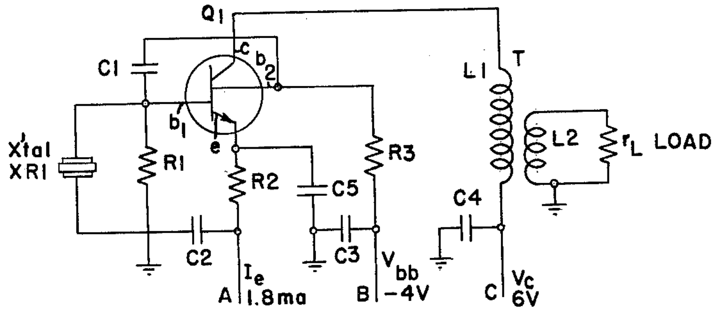
FIG. 1 is a schematic representation of the circuit of a preferred embodiment of the inventive oscillator.

Referring now to FIG. 1, a transistor stage Q1 may be provided which may include a tetrode transistor having a collector *c*, a circuit or first base *b*1, a second base *b*2, and an emitter *e*. A triode transistor could also be utilized in accordance with the teachings of the present invention. Disposed between the emitter and the bias point A (selected for emitter current $I_e$ may be equal to 1.8 milliamperes, for example) may be a resistor R2. Disposed between the circuit base *b*1 and ground may be a crystal XR1 and a resistor R1 in parallel. Connected between the bias point A of the tetrode Q1 and ground may be a capacitor C2. Disposed between the emitter *e* and ground may be a capacitor C5. Disposed between the second base *b*2 and the inter-base bias point B (inter-base bias point voltage $V_{bb}$ may be at minus 4 volts, for example) may be a resistor R3. Connected between the inter-base bias point B and ground may be a capacitor C3. Connected between the collector *c* of the tetrode Q1 and the collector bias voltage points C ($V_c$ may be 6 volts) may be an inductor L1 which may actually be the primary of a transformer T comprising inductor L1 and inductor L2. Between the collector bias voltage point C and ground may be disposed a capacitor C4. A load $r_L$ may be disposed across the secondary winding L2 of the transformer T and the load may be a resistor.

Operation of the oscillator may be described as follows:

Resistors R1, R2 and R3 are resistors which comprise the D.-C. bias circuit for base *b1*, emitter *e* and base *b2*, respectively. Actual load resistance is R1. Transformer T may be an RF transformer which may have a primary inductance L1 and a voltage ratio of *n* for proper transformation of load resistance $r_L$ to the primary side. Capacitors C1, C2, C3 and C4 may provide RF bypass. The crystal and the capacitor C5 determine the frequency of oscillation as will be explained. The transformer T1 which may be an RF (radio frequency) transformer may provide proper impedance transformation by stepping up the impedance of the load to the level of the primary winding. The crystal XR1 may be operated at a frequency between its series resonant frequency and its parallel resonant frequency. Therefore, looking into the crystal it appears inductive. Resistors R1, R2 and R3 may be large in value and therefore their A.-C. effects can be neglected.

Referring to the operation of the circuit of FIG. 1 when power is applied, for example, minus 4 volts at B, plus 6 volts at C and a voltage, sufficient to give an emitter current of 1.8 milliamperes at A, the oscillator will go almost immediately into oscillation. A transistor of the NPN type may be utilized. A PNP transistor could also be utilized equally well with the circuit but with bias voltages correspondingly adjusted. The General Electric Company's 3N36 transistor has proved very satisfactory in operation. Considering that current flows from the emitter to the collector to form a signal, the signal will be developed across the output inductor L1, the primary of T. With the power turned on and the transistor biased by resistors R1, R2 and R3 respectively, the impedance looking into the circuit *b1* to emitter *e* circuit at point A will appear as a negative resistance together with a capacitance; that is the input circuit will appear capacitive. This will be shown in the equations to be derived hereinbelow. The input circuit of crystal XR1 and resistor R1 being inductive, some compensation will have to be supplied in order to make the circuit appear anti-resonant. The input circuit will appear as a negative resistance because of the $h_{12}$ parameter of the transistor and internal feedback through the transistor. With an input circuit showing negative resistance and appearing capacitive, with the imposition of proper inductance, the circuit can appear resonant at a particular frequency. As shown in FIG. 4 this inductance is supplied by the crystal. Therefore, looking into the transistor we have a negative resistance circuit which presents an impedance which may be analyzed as consisting of a negative resistance and capacitive reactance in series therewith. The required inductance to make this circuit become resonant and tuned to a particular mode is supplied by the inductance of the crystal. The series circuit at the input comprising inductive reactance supplied by the crystal and comprising a negative resistance and a capacitance all in series comprises a tuned negative resistance circuit which will enable oscillation at the required mode to take place. Capacitor C5 from the emitter to ground in effect being across resistor R2, when taken in conjunction with the property of the impedance between the circuit base *b1* and the emitter *e* of stage Q1 will add a negative feedback element into the input circuit of crystal XR1 and resistor R1 to thereby control the total impedance of the circuit and insure operation of the circuit at the particular mode desired. If capacitor C5 is made of larger capacity and therefore smaller capacitive reactance (within limits) it can lower the mode at which the input circuit is operated. The larger the capacitance of capacitor C5 the smaller the capacitive reactance will be. With smaller capacitive reactance the circuit will operate at a lower mode. Thus, the higher the capacitance of capacitor C5, the lower the mode, and in contradistinction the lower the value of capacitance of capacitor C5 the higher the mode at which the oscillator input circuit will be operated. This provides a stepped change in resonance of the input circuit such that at critical values of capacitor C5 a change in mode may be effected. With the condition of negative resistance and tuning thus provided, oscillations will be sustained. The feedback through the transistor provides the condition of negative resistance appearing at the input to the transistor. The output is taken at the collector and depending upon the inductive reactance for the inductance of inductor L1 it will be at the desired harmonic of crystal mode frequency.

Thus, we see that because of the characteristics of a transistor and the value of capacitance of capacitor C5 chosen, the circuit of FIG. 1 will provide oscillations; the oscillations being at the desired mode; the mode being determined by capacitor C5; and that an output harmonic of the mode frequency may be provided depending upon the inductance value of inductor L1.

Figure 2:
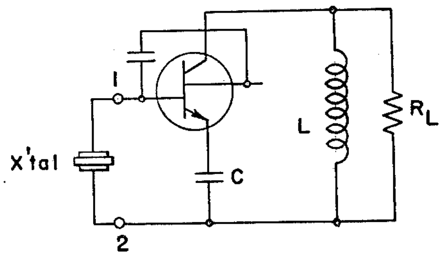
FIG. 2 is a simplified schematic representation of the embodiment of FIG. 1.

FIG. 2 presents a simplified circuit of the transistor oscillator of the invention. The conductances (A.-C. effects) of resistors R1, R2, and R3 and the capacitive reactances of capacitors C1, C2, C3, and C4 can be neglected because of the high values of resistance and capacitance involved. The circuit of FIG. 2 as will be hereinafter derived presents the theory of operation of the present oscillator with $r_L$ representing the equivalent load resistance of the oscillator.

Figure 3:
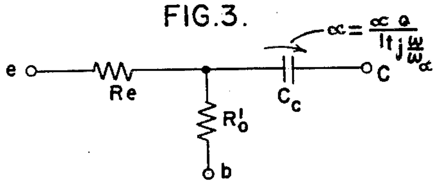
FIG. 3 is a simplified frequency T equivalent circuit of the transistor utilized with the present invention.

FIG. 3 represents simplified circuit T equivalent for the transistor. This figure shows the emitter *e*, the base *b* representing base *b1* of the transistor and the collector *c*. Disposed between the emitter and the base *b* will be an equivalent resistance $R_e$ which represents the emitter junction resistance and a resistance $r_{b'}$ which represents the base spread resistance. The collector to base capacitance or collector junction capacitance is shown by the schematic representation of $C_c$ and $\alpha_0$ is the value of $\alpha$ when operating at D.-C. or zero frequency.

As stated, using a simplified T equivalent circuit as shown in FIG. 3 for the transistor, the impedance between terminals 1 and 2 in FIG. 2 looking into the transistor can be shown to be:

$$z_{in}=h_{11}-\frac{h_{12}h_{21}}{h_{22}+Y_L} \qquad (1)$$

where $$Y_L=\frac{1}{R_L}+\frac{1}{j\omega L} \qquad (2)$$

and from the equivalent circuit of FIG. 3

$$h_{11}=\frac{\left(r_e+\frac{1}{j\omega C}\right)r_b'+\frac{1}{j\omega C_c}\left[\left(r_e+\frac{1}{j\omega C}\right)+r_b'(1-\alpha)\right]}{\left(r_e+\frac{1}{j\omega C}\right)+\frac{1}{j\omega C_c}(1-\alpha)} \qquad (3)$$

$$h_{12}=\frac{r_e+\frac{1}{j\omega C_c}}{\left(r_e+\frac{1}{j\omega C}\right)+\frac{1}{j\omega C_c}(1-\alpha)} \qquad (4)$$

$$h_{21}=\frac{-\left(r_e+\frac{1}{j\omega C}-\alpha\frac{1}{j\omega C_c}\right)}{\left(r_e+\frac{1}{j\omega C}\right)+\frac{1}{j\omega C_c}(1-\alpha)} \qquad (5)$$

$$h_{22}=\frac{1}{\left(r_e+\frac{1}{j\omega C}\right)+\frac{1}{j\omega C_c}(1-\alpha)} \qquad (6)$$

In a practical circuit $$\left|\frac{1}{j\omega C}\right|\gg r_e$$

Therefore $$h_{11}\cong\frac{\frac{r_b'}{j\omega C}+\frac{1}{j\omega C_c}\left[\frac{1}{j\omega C}+r_b'(1-\alpha)\right]}{\frac{1}{j\omega C}+\frac{(1-\alpha)}{j\omega C_c}}$$

$$\cong\frac{r_b'+\frac{C}{C_c}\left[\frac{1}{j\omega C}+r_b'(1-\alpha)\right]}{1+(1-\alpha)\frac{C}{C_c}} \qquad (7)$$

and $$\frac{h_{12}h_{21}}{h_{22}Y_L}\cong\frac{-\left(\frac{1}{j\omega C}-\frac{\alpha}{j\omega C_c}\right)}{1+(1-\alpha)\frac{C}{C_c}+j\omega CY_L\left[\frac{1}{j\omega C}+\frac{1-\alpha}{j\omega C_c}\right]^2} \qquad (8)$$

Using the relation $$\alpha=\frac{\alpha_0}{1+j\frac{\omega}{\omega_{\alpha b}}} \qquad (9)$$

Eq. 7 and 8 can be rearranged to give the real component of $Z_{in}$.

$$(1-\alpha_0)\ll\frac{\omega}{\omega_{ab}}\text{ and }\frac{C}{C_c}(1-\alpha_0)\ll 1$$

$$R_e(Z_{in})=\frac{r_b'\left[1+\left(1+\frac{C}{C_c}\right)^2\left(\frac{\omega}{\omega_{ab}}\right)^2\right]-\left(\frac{C}{C_c}\right)\frac{1}{\omega_{ab}C_c}}{1+\left[\frac{\omega}{\omega_{ab}}\left(1+\frac{C}{C_c}\right)\right]^2}$$

$$+\frac{\frac{1}{\omega_{ab}C}A-\frac{1}{\omega}\left(\frac{1}{C}-\frac{\alpha_0}{C_c}\right)B}{A^2+B^2} \qquad (10)$$

and imaginary component of $Z_{in}$ $$I_m(Z_{in})=j\frac{-\frac{1}{\omega C_c}-\frac{\omega}{\omega_{ab}}\left(1+\frac{C}{C_c}\right)\frac{1}{\omega_{ab}C_c}}{1+\left[\frac{\omega}{\omega_{ab}}\left(\frac{C}{1+C_c}\right)\right]^2}$$

$$+j\frac{\frac{1}{\omega_{ab}C}B-\frac{1}{\omega}\left(\frac{1}{C}-\frac{\alpha_0}{C_c}\right)A}{A^2+B^2} \qquad (11)$$

where $$A=1+\frac{\frac{C}{L}}{C_c^2(\omega_{ab}^2+\omega^2)}+\frac{1}{R_L}\left[\frac{1}{\omega_{ab}}\left(\frac{1}{C}+\frac{2}{C_c}\right)+\frac{\frac{\omega^2C}{\omega_{ab}}}{C_c^2(\omega_{ab}^2+\omega^2)}\right]$$

$$-\frac{1}{\omega^2LC}$$

$$B=\left(1+\frac{C}{C_c}\right)\frac{\omega}{\omega_{ab}}+\frac{1}{R_L}\left[\frac{\omega_C}{C_c^2(\omega_{ab}^2+\omega^2)}-\frac{1}{\omega_C}\right]$$

$$-\frac{1}{\omega L}\left[\frac{1}{\omega_{ab}}\left(\frac{1}{C}+\frac{2}{C_c}\right)+\frac{\frac{\omega^2C}{\omega_{ab}}}{C_c^2(\omega_{ab}^2+\omega^2)}\right]$$

If $Y_L$ is large and the term $$\frac{h_{12}h_{21}}{h_{22}Y_L}$$

can be neglected, then $$(Re)(Z_{in})\cong\frac{r_b'\left[1+\left(1+\frac{C}{C_c}\right)^2\left(\frac{\omega}{\omega_{ab}}\right)^2\right]-\left(\frac{C}{C_c}\right)\frac{1}{\omega_{ab}C_c}}{1+\left[\frac{\omega}{\omega_{ab}}\left(1+\frac{C}{C_c}\right)\right]^2} \qquad (10a)$$

and $$I_m(Z_{in})\cong j\frac{-\frac{1}{\omega C_c}-\frac{\omega}{\omega_{ab}}\left(1+\frac{C}{C_c}\right)\frac{1}{\omega_{ab}C_c}}{1+\left[\frac{\omega}{\omega_{ab}}\left(1+\frac{C}{C_c}\right)\right]^2} \qquad (11a)$$

Since this input impedance $Z_{in}$ is directly across the crystal as shown in FIG. 4, a negative resistance must exist in order to produce oscillation. Thus, from Eq. 10a $$\left(\frac{C}{C_c}\right)\frac{1}{\omega_{ab}C_c}\geq r_b'\left[1+\left(1+\frac{C}{C_c}\right)^2\left(\frac{\omega}{\omega_{ab}}\right)^2\right] \qquad (12)$$

In order to find the range of $$\frac{C}{C_c}\left(\frac{\text{C5}}{\text{transistor capacitance}}\right)$$

with which the negative resistance exists, we set $$\left(\frac{C}{C_c}\right)\frac{1}{\omega_{ab}C_c}=r_b'\left[1+\left(1+\frac{C}{C_c}\right)^2\left(\frac{\omega}{\omega_{ab}}\right)^2\right] \qquad (13)$$

or $$\left(\frac{C}{C_c}\right)^2+\left[2-\frac{(\omega_{ab}/\omega)^2}{\omega_{ab}C_cr_b'}\right]\left(\frac{C}{C_c}\right)+\left(\frac{\omega_{ab}}{\omega}\right)^2=0$$

and $$\frac{C}{C_c}=\frac{\left(\frac{\omega_{ab}}{\omega}\right)^2\frac{1}{\omega_{ab}C_cr_b'}-2\pm\sqrt{\left[\left(\frac{\omega_{ab}}{\omega}\right)^2\frac{1}{\omega_{ab}C_cr_b'}-2\right]^2-4\left(\frac{\omega_{ab}}{\omega}\right)^2}}{2} \qquad (14)$$

where:

$C$ =capacitance of capacitor C
$C_c$ =collector to base capacitance
$r_b^1$=base spreading resistance
$\omega_{ab}$ =angular cut-off frequency in the common base configuration.

Which is the equation to solve for the ratio of C5 to collector to base, *b*1 capacitance.

For instance, $$\frac{1}{\omega_{ab}C_cr_b'}=3,\ \frac{\omega_{ab}}{\omega}=2$$

The ratio $$\frac{C}{C_c}\text{ should be }0.43<\frac{C}{C_c}<9.6$$

and the negative resistance reaches a maximum when $$\frac{C}{C_c}=0.9$$

To insure a strong oscillation, therefore, the ratio of $\frac{C}{C_c}$ should be about 0.9 in this example.

The frequency of oscillation can be calculated from the reactive component of $Z_{in}$ given by Eq. 11*a* and the equivalent inductance $L_e$ of the crystal as given by $$\omega L_e=\frac{\left(\omega L-\frac{1}{\omega C_s}\right)}{r^2+\left(\omega L-\frac{1}{\omega C_s}\right)^2}-\omega C_p$$

Thus $$\frac{1}{\left[\dfrac{\omega L-\dfrac{1}{\omega C_c}}{r^2+\left(\omega L-\dfrac{1}{\omega C_c}\right)^2}-\omega C_p\right]}=\frac{\dfrac{1}{\omega C_c}+\dfrac{\omega}{\omega_{\alpha b}}\left(1+\dfrac{C}{C_c}\right)\dfrac{1}{\omega_{\alpha b}C_c}}{1+\left[\dfrac{\omega}{\omega_{\alpha b}}\left(1+\dfrac{C}{C_c}\right)\right]^2} \quad (15)$$

Let the equivalent capacitance given by Eq. 11*a* be $C_e$. Then $$C_e=C_c\frac{1+\left[\dfrac{\omega}{\omega_{\alpha b}}\left(1+\dfrac{C}{C_c}\right)\right]^2}{1+\left(\dfrac{\omega}{\omega_{\alpha b}}\right)^2\left(1+\dfrac{C}{C_c}\right)} \quad (16)$$

The equivalent capacitance $C_e$ is effectively in parallel with $C_p$ of the crystal. The frequency of oscillation is slightly below the parallel resonant frequency of the crystal.

If $Y_L$ is not very large, the term $$\frac{h_{12}h_{21}}{h_{22}Y_L}$$

is not negligible. Eqs. 10 and 11 should be used to calculate the condition of oscillation and the frequency of the oscillation.

With proper values of $C_L$ in the circuit shown in FIG. 2, the resistance R of Equation 11*a* can be designed to have a negative value. Consequently, the equivalent circuit shown in FIG. 4 will oscillate at frequencies where the crystal appears inductive. Since a crystal has only a very narrow frequency region in which its impedance is inductive as shown in FIG. 5, the frequency of oscillation is controlled by the crystal. While not to be construed as limiting the present invention, experimentally excellent results were obtained with component values as follows:

*C*1, *C*2, *C*3, *C*4=.01 μf.
*R*1=6.6K ohms
*R*2=4.8 ohms
*R*3=4.7K ohms
*L* =2 μh.
C5=10 μμf.

At room temperature at 11 mc. a frequency change of only 3.9 parts per million per 10% change of supply voltage may be obtained with this circuit and it proved capable of limiting frequency change to only .22 parts per million per degree change of ambient temperature. This embodiment of the inventive oscillator could be oscillated at the third, fifth and seventh overtone of the crystal frequency. Also for a given set of component values, the frequency of oscillation may be readily changed from 27 megacycles to 48 megacycles by merely changing the crystals, no adjustment of circuit components being necessary. The inventive apparatus as thus exemplified is insensitive to change in parameters, between different transistors. For frequencies below 15 megacycles, either the tetrode shown may be used or a triode transistor will perform entirely satisfactorily in this circuit.

There thereby is provided a crystal controlled high frequency transistor oscillator which will have no external feedback; where the frequency of oscillation may be determined by the crystal only; where change of crystals may be effected without requirement for circuit adjustment, and wherein it is possible to operate the circuit at harmonics of the crystal as well as its fundamental frequency. The present invention provides a very stable oscillator, the circuit of the invention will not oscillate without the crystal and it will oscillate at the overtone frequency of the crystal.

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. The appended claims are therefore intended to cover and embrace any such modifications within the limits only of the true spirit and scope of the invention.

What is claimed is:

1. A high frequency oscillator comprising a semi-conductor having an emitter, a collector and at least one base, a capacitor disposed between said emitter and ground, collector voltage source means, an output inductive circuit connected between said collector and said collector voltage source means, an input circuit disposed between said base and ground, said input circuit comprising a crystal and a resistor in parallel, said semi-conductor havcharacteristics of feedback therethrough from said collector to said base, the oscillator thereby providing for inphase feedback from said collector to said base, said capacitor being of relatively very small capacitance and of size such that the crystal is operated between the series resonant mode and the parallel resonant mode.

2. A crystal controlled high frequency transistor oscillator operable with internal feedback and wherein the frequency of oscillation may be determined by the crystal only, said oscillator being operable at harmonics of the crystal mode, the harmonics of the crystal fundamental frequency, and the fundamental frequency of the crystal, said oscillator comprising a junction transistor having an emitter, a collector, and a base, a base input circuit comprising a crystal and a resistor in parallel disposed between said base and ground, a source of emitter current, a resistor connected between said source of emitter current, and said emitter, a source of collector voltage, an output inductor connected between said collector and said source of collector voltage, a capacitor disposed between said emitter and ground, said crystal being operated at a frequency between a series resonant frequency and its parallel resonant frequency to appear as an inductance, said input crystal and resistor forming an input impedance providing for a negative resistance, said capacitor being of capacitance value in ratio to the transistor collector to base capacitance such as to be within the range of said ratio within which a negative resistance condition of the input circuit exists.

3. The apparatus of claim 2 wherein said ratio of capacitor capacitance to collector to base capacitance will be in accordance with the equation $$\left(\frac{C}{C_c}\right)=\frac{\left(\dfrac{\omega_{\alpha b}}{\omega}\right)^2\dfrac{1}{\omega_{\alpha b}C_c r_b'}-2\pm\sqrt{\left[\left(\dfrac{\omega_{\alpha b}}{\omega}\right)^2\dfrac{1}{\omega_{\alpha b}C_c r_b'}-2\right]^2-4\left(\dfrac{\omega_{\alpha b}}{\omega}\right)^2}}{2}$$

where:

$C$=capacitor capacitance
$C_c$=collector to base capacitance
$r_b^1$=base spreading resistance
$\omega_{\alpha b}$=angular cut-off frequency in the common base configuration.

4. A crystal controlled high frequency transistor oscillator, said oscillator comprising a junction transistor, said transistor comprising an emitter, a first base, a second base, and a collector, a first RF bypass capacitor disposed between said first and said second base, a source of emitter current to cause emitter current of the order of 1.8 milliamps, a source of second base bias voltage of the order of negative 4 volts, a source of collector voltage of the order of 6 volts, an output inductor disposed between said collector and said 6 volts source, a first resistor of relatively large resistance value disposed between said second base and said second base voltage source, a second resistor disposed between said emitter current source and said emitter, a crystal and a third resistor in parallel disposed between said first base and ground, a second capacitor disposed between said source of emitter current and ground, a third capacitor disposed between said 6 volts source and ground, a fourth capacitor disposed between said emitter and ground, said emitter to ground fourth capacitor being of the order of ten $\mu\mu$f. and of substantially exact size as to determine the mode of operation of said crystal, said transistor providing for internal feedback between said collector and said base, said input crystal and resistor parallel circuit in conjunction with said emitter to ground capacitor being proportioned in impedance characteristics to provide for operation between the series resonant mode and the parallel resonant mode of said crystal oscillator.

5. The apparatus of claim 4 wherein said base to base capacitor, said source to ground capacitors and said collector to base capacitor are of the order .01 microfarad, wherein each of said resistors is of the order of several thousand ohms, wherein said inductor is of the order of 2 microhenries, the values of capacitance of said emitter to ground capacitor and of inductance of said inductor thereby providing a negative resistance in the input circuit, internal feedback between the collector and said first base of said transistor in conjunction with the negative resisance of said input circuit thereby providing for stable oscillations.

6. A crystal controlled transistor oscillator for operation at very high frequency in the 10 to 50 megacycle frequency range with frequency stability despite change in supply voltage and temperature variations, said oscillator comprising a junction transistor, said junction transistor comprising a collector, a base and an emitter, an input circuit comprising a crystal and a resistor in parallel disposed between said base and ground and operated between the series resonant and the parallel resonant modes, a unidirectional source of collector voltage, an output inductive circuit connected between said collector and said collector voltage source, and a relatively small capacitor disposed between said emitter and ground, said capacitor thereby providing an impedance when taken in conjunction with the input impedance to thereby provide for determining the mode of operation of said crystal oscillator and providing for stable oscillation in conjunction with feedback between the collector and the base of said transistor.

7. In a crystal oscillator, the combination comprising a semiconductive element having at least input, output and common electrodes, an input circuit including said input and common electrodes, an output circuit including said output electrode and said common electrode, means to produce an impedance across said input circuit which includes a negative resistance component and a reactance component including capacitance means coupled between said common electrode and a point of reference potential, a crystal element coupled between said input electrode and point of said reference potential, said crystal being operated between the series resonant mode and the parallel resonant mode and said crystal presenting an inductive reactance across said input at a frequency between its series and parallel resonant mode whereby said oscillator oscillates at that frequency at which the inductive reactance of said crystal and the reactive component of the impedance across said input terminals are series resonant, and load means for abstracting oscillatory energy coupled between said output electrode and a terminal adapted to have biasing potential impressed thereon.

References Cited in the file of this patent

UNITED STATES PATENTS 2,570,436 Eberhard et al. ---------- Oct. 9, 1951
2,751,498 Malchow -------------- June 19, 1956
2,769,908 Stansel ---------------- Nov. 6, 1956